(12) United States Patent
Ricavy

(10) Patent No.: US 7,449,922 B1
(45) Date of Patent: Nov. 11, 2008

(54) SENSING CIRCUITRY AND METHOD OF DETECTING A CHANGE IN VOLTAGE ON AT LEAST ONE INPUT LINE

(75) Inventor: Sebastien Nicolas Ricavy, Saint Martin d'Heres (FR)

(73) Assignee: ARM Limited, Cambridge (GB)

( * ) Notice: Subject to any disclaimer, the term of this patent is extended or adjusted under 35 U.S.C. 154(b) by 34 days.

(21) Appl. No.: 11/812,237

(22) Filed: Jun. 15, 2007

(51) Int. Cl.
*G01R 19/00* (2006.01)
*G11C 7/00* (2006.01)
*H03F 3/45* (2006.01)

(52) U.S. Cl. .............................. 327/57; 327/51; 327/52; 327/55; 327/56; 365/205; 365/207

(58) Field of Classification Search .................. 327/51, 327/52, 55–57; 365/205, 207
See application file for complete search history.

(56) References Cited

U.S. PATENT DOCUMENTS 6,433,589 B1 * 8/2002 Lee .............................. 326/115
7,046,045 B2 * 5/2006 Nakazato et al. ............... 327/55
7,400,525 B1 * 7/2008 Kim ............................ 365/156
2005/0264324 A1 12/2005 Nakazato et al.

* cited by examiner

*Primary Examiner*—Long Nguyen
*Assistant Examiner*—Brandon S Cole
(74) *Attorney, Agent, or Firm*—Nixon & Vanderhye P.C.

(57) ABSTRACT

Sensing circuitry and a method of operating such sensing circuitry are provided. The sensing circuitry has voltage change detection circuitry for detecting a change in voltage on at least one input line and for producing at least one output signal indicative of that change during a sensing stage of operation. The voltage change detection circuitry comprises at least one latch transistor having a body region insulated from a substrate. Further, body biasing circuitry is provided which, prior to the sensing stage of operation, causes a voltage to be applied to the body region that is derived from the voltage on one of said at least one input lines. Then, during the sensing stage of operation, the body biasing circuitry causes the voltage of the body region to float. Such an arrangement enables removal of the history effect that can sometime affect such latch transistors, whilst alleviating power consumption and noise issues that can occur in certain known sensing circuits.

16 Claims, 7 Drawing Sheets

SENSING CIRCUITRY AND METHOD OF DETECTING A CHANGE IN VOLTAGE ON AT LEAST ONE INPUT LINE

BACKGROUND OF THE INVENTION

1. Field of the Invention

The present invention relates to sensing circuitry and a sensing method for detecting a change in voltage on at least one input line to the sensing circuitry.

2. Description of the Prior Art

Sensing circuitry is often used in integrated circuits, and may be used in a variety of implementations, for example in semiconductor memories, microprocessors, large logic arrays, etc. Such sensing circuitry has voltage change detection circuitry for detecting a change in voltage on at least one input line and for producing at least one output signal indicative of that change. The voltage change detection circuitry typically comprises one or more latch transistors used to produce at least one output signal indicative of the detected change in voltage.

Whilst such latch transistors can take a variety of forms, one known approach involves using one or more latch transistors that have a body region insulated from a substrate. The body region comprises the channel material in which a channel is established between the source and drain of the transistor below the gate of the transistor. By using latch transistors having a body region insulated from the substrate, it has been found that this reduces the capacitive loading on the transistor terminals when compared with latch transistors formed from non-insulated technologies where the channel material is formed on a conducting substrate. This reduced capacitive loading can give rise to increase switching speed of the transistors and lower power dissipation.

One known technology that can be used to produce transistors having a body region insulated from the substrate is referred to as Silicon-On-Insulator (SOI) technology, where the SOI channel material is formed within a region of a thin superficial silicon layer above an oxide insulating layer and located under the gate of the transistor, reducing resistive leakage to the substrate and capacitive loading by the substrate. Consequently, this body region is not biased to any known voltage, and its voltage can vary depending on charges arising from diode leakage, coupling capacitance with the gate, drain or source, impact ionisation, etc. Additionally, the voltage on the body region becomes dependent on the previous circuit activity, which is typically referred to as the "history effect". This variation in voltage on the body region can have a significant impact on the behaviour of a circuit constructed using such transistors, since any change in the body voltage will typically modify the threshold voltage of the transistor, thus modifying the current passing through the transistor and the switching speed of the transistor. When such transistors are used in sensing circuitry used to detect a change in voltage on at least one input line, such changes in the body voltage can give rise to incorrect operation of the sensing circuitry.

One known technique used to remove the earlier-mentioned history effect involves biasing the bodies of certain transistors within the sensing circuitry to a fixed reference voltage, for example by coupling the bodies to ground for an N-channel transistor, or coupling the bodies to the power supply voltage for a P-channel transistor. Whilst this can remove the history effect, it is disadvantageous in that this body biasing can give rise to an increase in MOSFET (metal oxide semiconductor field effect transistor) threshold voltage, and so can give rise to delayed switching, thus increasing the time taken by the sensing circuitry to detect a change in voltage.

U.S. Pat. No. 6,433,589 describes an alternative approach to biasing the transistor bodies with a fixed reference. In particular, a sense amplifier is described where the bodies of amplifier transistors within a sense amplifier and bodies of input transistors to the sense amplifier are coupled to corresponding input signals, thereby eliminating the history dependence that would result from unconnected bodies, while achieving faster switching times due to a dynamically produced difference in threshold voltage of the input transistors and amplifier transistors. However, whilst such an approach may improve switching times when compared with circuits using input transistors and amplifier transistors having statically biased bodies, such an approach can give rise to a number of disadvantages.

Firstly, by making a direct connection between the bodies of the transistors and the input signals, these input signals being the bit line signals in the circuit described in U.S. Pat. No. 6,433,589, this involves applying the supply voltage or a voltage close to the supply voltage to the body of the transistors. Consequently, the diode formed between the body region and the source region of such transistors will become strongly forward-biased as soon as the source of the transistor is lowered to ground potential, this occurring every time the sense amplifier is turned on to perform a sensing operation. Additionally, the diode will remain strongly forward-biased for as long as the voltage on the source is maintained at the ground potential, and hence will remain strongly forward-biased for as long as the sense enable signal is active, i.e. during the whole sensing operation. This can give rise to significant extra power consumption due to the forward-biased diode current, and can give rise to disturbance of the connected bit line signal, thereby producing noise.

In addition, the presence of the forward-biased diode causes the connected bit lines to discharge more than would otherwise be the case, thus resulting in further increased power consumption required after the sensing operation has completed in order to raise the voltage on those bit lines back to the source potential $V_{DD}$.

US-A-2005/0264324 describes systems and methods for increasing the amount of current that can flow through the data line pull-down transistors in a sense amplifier by tying the bodies of those transistors to a voltage other than ground. In one embodiment, the bodies of data line pull-down transistors are tied to the intermediate nodes on the opposing side of the sense amplifier to increase the current flow through the data line pull-down transistors, which increases the speed at which the sense amplifier can be operated. Further, because the voltages at the intermediate nodes change, the threshold voltages of the transistors also change, thereby enhancing the operation of the sense amplifier. However, since one of the intermediate nodes will remain at the source voltage level during the sensing operation, and that source potential is applied to the body of one of the transistors on the other side of the sense amplifier, this will again give rise to a forward-biased diode in that transistor, thus giving rise to additional power consumption. This forward-biased diode can also give rise to noise on an associated bit line assuming that the bit line remains connected to the sense amplifier during the sensing operation.

Accordingly, it would be desirable to provide an improved sensing circuitry and method of operation of such circuitry which is able to maintain robustness to the history effect described earlier, but without the disadvantages associated with the above-mentioned prior art schemes.

SUMMARY OF THE INVENTION

Viewed from a first aspect, the present invention provides sensing circuitry, comprising: voltage change detection circuitry for detecting a change in voltage on at least one input line and for producing at least one output signal indicative of said change during a sensing stage of operation; said voltage change detection circuitry comprising at least one latch transistor having a body region insulated from a substrate; and body biasing circuitry which prior to the sensing stage of operation causes a voltage to be applied to the body region that is derived from the voltage on one of said at least one input lines, and which during said sensing stage of operation causes the voltage of the body region to float.

In accordance with the present invention, body biasing circuitry is provided which, prior to the sensing stage of operation, causes a voltage to be applied to the body region of one or more latch transistors, that voltage being derived from the voltage on an input line to the circuitry. Additionally, the body biasing circuitry is arranged, during the sensing stage of operation, to cause the voltage of the body region to float. Through use of the present invention, the body region of one or more latch transistors can be precharged to a known voltage level prior to the sensing stage of operation taking place, which means that those bodies cannot drift to unknown voltage levels over time due to the history effect. Accordingly, the possibility for such history effects to disturb the correct operation of the sensing circuitry is removed. Further, by causing the voltage of the body region to float during the sensing stage of operation, this avoids the creation of a forward-biased diode during the entirety of the sensing operation, thereby reducing power consumption. In particular, because the voltage on the body region is floating during the sensing stage (i.e. is not tied to any voltage), any such forward-bias effect quickly disappears. Furthermore, since the voltage of the body region is made to float during the sensing stage of operation, there is no connection between the body region and the input lines during the sensing stage of operation, and accordingly the voltage on the body region will not give rise to any noise being generated on the input lines.

In one embodiment, said at least one latch transistor comprises a pair of latch transistors and said at least one input line comprise a pair of input lines, the pair of latch transistors being used to detect a differential between the voltages on the pair of input lines caused by said change in voltage. Further, in one such embodiment the body biasing circuitry is arranged to cause a first voltage to be applied to the body region of a first latch transistor in said pair of latch transistors, the first voltage being derived from the voltage on a first input line of said pair of input lines, and to cause a second voltage to be applied to the body region of a second latch transistor in said pair of latch transistors, the second voltage being derived from the voltage on a second input line of said pair of input lines, during said sensing stage of operation the body biasing circuitry causing the voltages of the body regions of both the first and second latch transistors to float.

In such embodiments where a pair of input lines are employed, then initially both of the input lines will be at a predetermined voltage level (for example the supply voltage level) and then the voltage on one of the input lines will start to change (e.g. decrease towards ground). Once that voltage has changed by a predetermined amount, referred to herein as $\Delta V$, the sensing stage of operation will be activated. Since in the above described embodiment, the body biasing circuitry causes a first voltage derived from the voltage on a first input line to be applied to the body region of a first latch transistor, and a second voltage derived from the voltage on a second input line to be applied to the body region of a second latch transistor, then at the time the sensing stage of operation begins, the bodies of the pair of latch transistors will already have a differential voltage of $\Delta V$, which will cause one of the latch transistors in the pair to be driven more strongly, thereby improving the switching time of the sensing circuitry. In particular, the latch transistor in the pair that has the higher body region voltage at the start of the sensing stage of operation will conduct more strongly, and accordingly have a higher current flow through it, and this latch transistor will be the one that needs to discharge an intermediate node with which it is connected in order to produce the required output. Accordingly, by the above described approach, the differential pair of latch transistors is always unbalanced on the correct side, thereby predisposing the differential pair of latch transistors to produce the required output signal.

In one particular embodiment of the present invention, at the start of the sensing stage of operation, each latch transistor in the pair is arranged to receive at its gate a voltage that corresponds to the voltage on an associated bit line at the time the sensing stage was activated. The current through a latch transistor will increase the higher the voltage applied to the gate. Further, the current will increase the lower the threshold voltage of the transistor, and a transistor having a higher voltage on the body will have a lower threshold voltage. In this particular embodiment of the present invention, the latch transistor in the pair which needs to discharge the voltage applied across it in order to produce the required output signal will have both a higher voltage applied to its gate than is applied to the gate of the other transistor in the pair, and will also have a higher body voltage by virtue of the above-described operation of the body biasing circuitry, and these two factors will both contribute to causing that latch transistor to be driven more strongly than the other latch transistor, thereby increasing the switching speed.

The pair of latch transistors may be arranged in a variety of ways, but in one embodiment the pair of latch transistors are cross-coupled. Accordingly, the gate of one latch transistor is coupled to the drain of the other latch transistor, and vice versa.

There are a number of ways in which the voltage change detection circuitry can be coupled with the at least one input line. However, in one embodiment, the sensing circuitry further comprises an input transistor associated with each of said at least one input lines and arranged to couple the associated input line with said at least one latch transistor, said input transistor receiving a sensing enable signal at its gate which disables the input transistor during said sensing stage. Hence, in accordance with such embodiments, during the sensing stage the at least one input line is decoupled from the voltage change detection circuitry and the change in voltage on the at least one input line is detected by analysis of the voltage present on at least one intermediate node within the voltage change detection circuitry.

The body biasing circuitry can take a variety of forms. However, in one embodiment the body biasing circuitry comprises a precharge biasing transistor associated with each of said at least one input lines and arranged to couple the associated input line with the body region of at least one of said at least one latch transistors, said precharge biasing transistor receiving an enable signal at its gate which disables the precharge biasing transistor during said sensing stage so as to cause the voltage of the body region to float.

In one embodiment, the enable signal is formed by the sensing enable signal that is also provided to one or more input transistors of the sensing circuitry used to couple each input line with the at least one latch transistor.

The manner in which each precharge biasing transistor is coupled with the associated input line can take a variety of forms. In one embodiment, each precharge biasing transistor has one of its drain or its source connected to the associated input line and the other of its drain or its source connected to the body region of each latch transistor associated with that precharge biasing transistor. In an alternative embodiment, each precharge biasing transistor has one of its drain or its source connected to one of said one or more input transistors and the other of its drain or its source connected to the body region of each latch transistor associated with that precharge biasing transistor. Hence, in this latter embodiment, the precharge biasing transistor is coupled with its associated input line via an associated input transistor. During the sensing stage both the input transistor and the precharge biasing transistor are disabled.

In one embodiment where there are a pair of latch transistors and a pair of input lines, the body biasing circuitry comprises a pair of precharge biasing transistors, each precharge biasing transistor being associated with one input line of said pair of input lines and arranged to couple the associated input line with an associated latch transistor of said pair of latch transistors, each precharge biasing transistor receiving an enable signal at its gate which disables that precharge biasing transistor during said sensing stage so as to cause the voltage of the body region of the associated latch transistor to float.

In one embodiment where the sensing circuitry has at least one input transistor for coupling an associated input line with the at least one latch transistor, each input transistor can also be formed such that it has a body region insulated from the substrate. In one such embodiment, the body biasing circuitry is further arranged prior to the sensing stage of operation to cause a voltage to be applied to the body region of each input transistor that is derived from the voltage on one of the at least one input lines, and during the sensing stage of operation the body biasing circuitry causes the voltage of the body region of each input transistor to float. Hence, in such embodiments, the body biasing circuitry operates not only on at least one latch transistor but also on at least one input transistor.

The latch transistors can take a variety of forms. However, in one embodiment each latch transistor comprises a body-contact MOSFET (metal oxide semiconductor field effect transistor) device. The input transistors and precharge biasing transistors can also be formed as MOSFET devices, and one or more of those transistors may also be formed as body-contact MOSFET devices to allow a voltage to be applied to the body region. The various transistor devices of the sensing circuitry can be formed as NMOS or PMOS devices, with appropriate voltage potentials applied across those devices. In one particular embodiment, one pair of latch transistors are NMOS devices and the input transistors are PMOS devices. Further, in one embodiment, the precharge biasing transistors are PMOS devices.

There are a number of technologies which may be used to produce a latch transistor having a body region insulated from the substrate. However, in one embodiment, each latch transistor is fabricated as a silicon-on-insulator (SOI) device.

The sensing circuitry may be used in a variety of situations, and accordingly the input lines can take a variety of forms. In one embodiment, each input line is a bit line coupled with a memory device, and the sensing circuitry forms a sense amplifier for detecting a value stored in a memory cell of the memory device. Hence, in such embodiments, the sensing circuitry is used in association with a memory device in order to detect the values stored in one or more addressed memory cells of that memory device by detecting a change in voltage in at least one bit line coupled with the relevant addressed memory cell.

Viewed from a second aspect, the present invention provides a sense amplifier for detecting a value stored in a memory cell, comprising: voltage change detection circuitry for detecting a change in voltage on at least one bit line connected to the memory cell and for producing at least one output signal indicative of said change during a sensing stage of operation; value determination circuitry for determining said value from said at least one output signal; said voltage change detection circuitry comprising at least one latch transistor having a body region insulated from a substrate; and body biasing circuitry which prior to the sensing stage of operation causes a voltage to be applied to the body region that is derived from the voltage on one of said at least one bit lines, and which during said sensing stage of operation causes the voltage of the body region to float.

Viewed from a third aspect, the present invention provides sensing circuitry, comprising: voltage change detection means for detecting a change in voltage on at least one input line and for producing at least one output signal indicative of said change during a sensing stage of operation; said voltage change detection means comprising at least one latch means having a body region insulated from a substrate; and body biasing means for applying a voltage level to the body region prior to the sensing stage of operation, the voltage level being derived from the voltage level on one of said at least one input lines, the body biasing means further for causing the voltage of the body region to float during said sensing stage of operation.

Viewed from a fourth aspect, the present invention provides a method of operating sensing circuitry used to detect a change in voltage on at least one input line connected to the sensing circuitry, and to produce at least one output signal indicative of said change during a sensing stage of operation, said sensing circuitry including at least one latch transistor having a body region insulated from a substrate, and the method comprising the steps of: prior to the sensing stage of operation, applying a voltage to the body region that is derived from the voltage on one of said at least one input lines; and during said sensing stage of operation, causing the voltage of the body region to float.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

The sensing circuitry of embodiments of the present invention may be employed in a variety of situations with a data processing apparatus. For the purposes of illustrating one particular embodiment, the sensing circuitry will be considered to be a sense amplifier used in association with a memory device.

Figure 1:
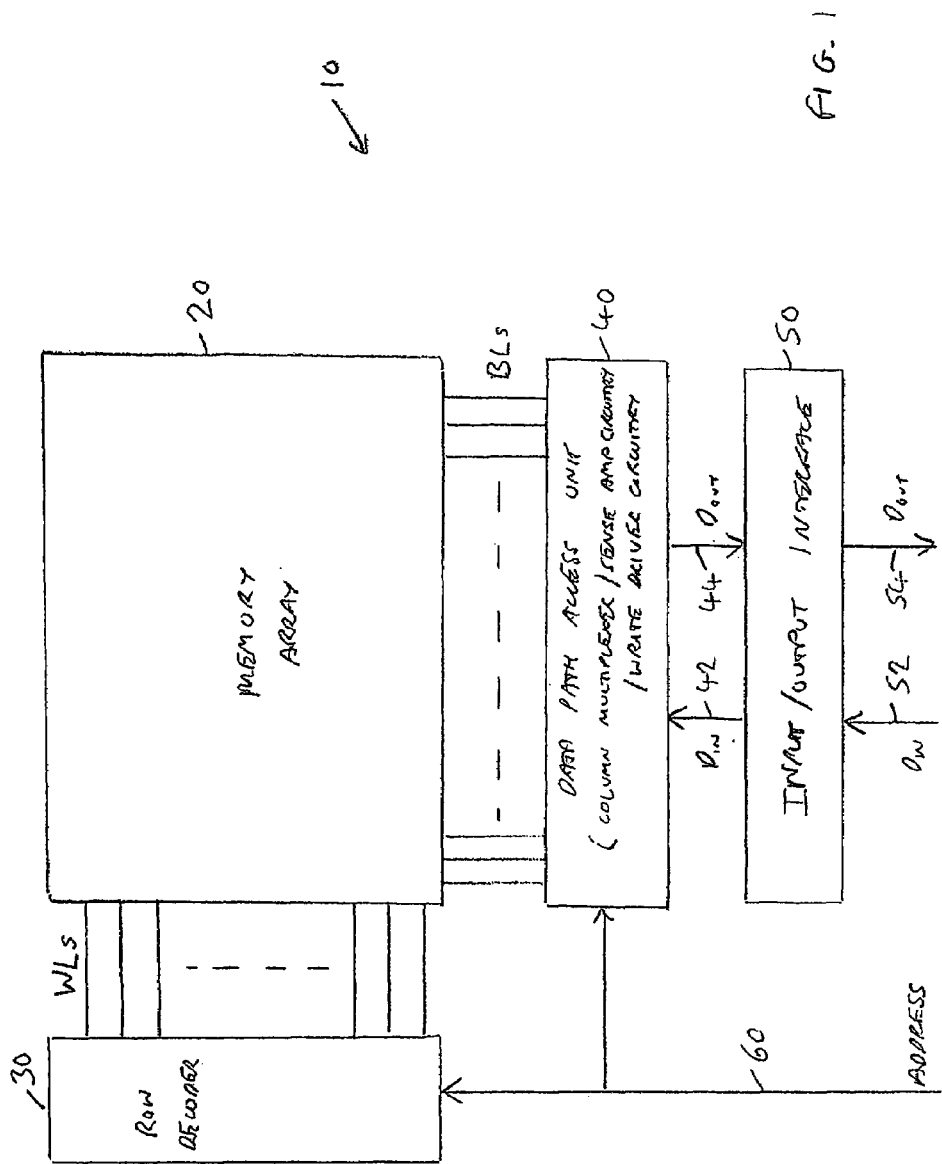
FIG. 1 is a block diagram of a memory device in which sense amplifier circuitry in accordance with one embodiment of the present invention may be employed.

FIG. 1 is a block diagram of one such memory device. The memory device 10 has a memory array 20 consisting of a plurality of memory cells arranged in rows and columns. Each row has a word line (WL) connected thereto, and each column has at least one bit line (BL) connected thereto, the exact number of bit lines connected to each column being dependent on the implementation. In one example implementation, the memory array consists of SRAM cells, and a pair of bit lines are connected to each column of cells.

When a memory access request is received by the memory device, the address specified by the memory access request is routed over path 60 to a row decoder 30 and to a data path access unit 40. The row decoder 30 is arranged to decode the address and dependent thereon drive a control signal over one of the word lines in order to select one of the rows within the memory array 20. Similarly, the data path access unit 40 is arranged dependent on the address to identify the column or columns containing the data to be accessed, and to activate the respective bit lines.

For a read operation, such activation involves selecting the appropriate bit lines via a column multiplexer, and then using sense amplifier circuitry to observe variation on the voltage of the bit lines in order to determine the data stored in the addressed memory cell or memory cells. In particular, considering the earlier-mentioned SRAM example where a pair of bit lines are connected to each memory cell, these bit lines will initially be precharged to a supply voltage level, and when the relevant row of cells are selected via a drive signal on the relevant word line, one of the pair of bit lines connected to an addressed memory cell will start to discharge towards a ground voltage level, which of the bit lines in the pair discharges being dependent on the value stored therein. The discharging of one of the bit lines in the pair is sensed by the sense amplifier circuitry, which then produces an output signal over path 44 indicating the data stored in the addressed memory cell or memory cells. This output signal is then routed via the input/output interface 50 over path 54 to be returned as the read data to the source of the read access request.

In accordance with embodiments of the present invention, the sense amplifier circuitry is constructed as will be discussed in more detail later with at least one pair of latch transistors having body regions insulated from a substrate, and with body biasing circuitry used to improve operation of the sensing circuitry.

For a write access request, the row decoder 30 operates in the same manner to select the relevant row by issuing a drive signal on the associated word line, and then write driver circuitry in the data path access unit 40 is used to alter the voltage on the relevant bit line or bit lines in order to cause the state held in the relevant memory cell or memory cells to be updated to reflect the data being written. Hence, the write data is routed over path 52 to the input/output interface 50 and from there over path 42 to the data path access unit 40. The write data will then be used to generate the appropriate control signals for the write driver circuitry to cause the voltage on one or more bit lines to be altered to cause the state of the addressed memory cell or memory cells to be updated. Hence, again considering the earlier-mentioned SRAM example, both of the bit lines associated with a particular column will initially be precharged, and dependent on the data to be written, one of the bit lines in the pair will be discharged by the write driver circuitry to cause the state in the addressed memory cell to be updated.

Figure 2:
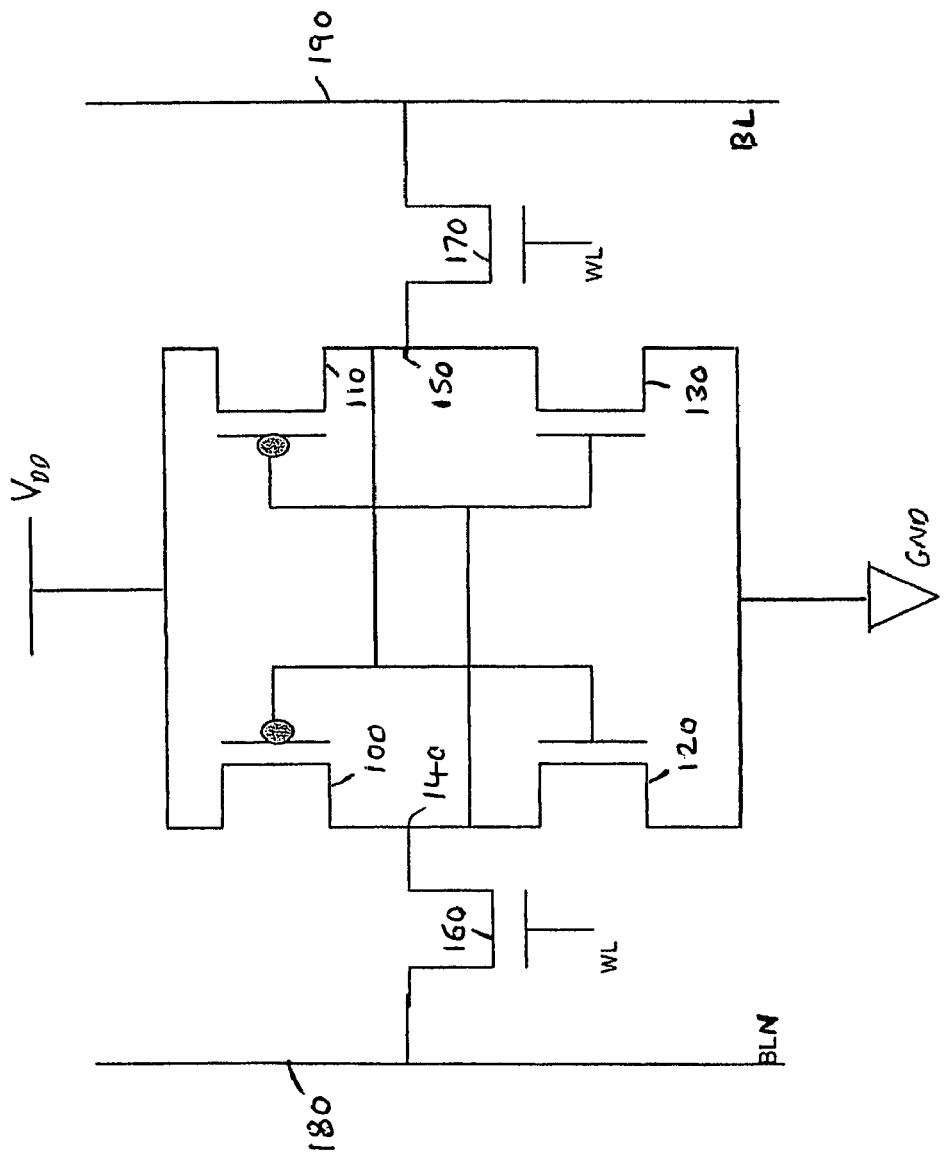
FIG. 2 is a diagram illustrating an example construction of a memory cell that may be used within the memory array of FIG. 1.

The memory cells of the memory device can take a variety of forms. However, by way of example, FIG. 2 is a diagram illustrating an example construction of a memory cell that may be used in an SRAM memory. As can be seen, the memory cell consists of two PMOS transistors 100, 110 and two NMOS transistors 120, 130. A node 140 is provided between the PMOS transistor 100 and the NMOS transistor 120, and similarly a node 150 is provided between the PMOS transistor 110 and the NMOS transistor 130. The bit line 180 is connected to the node 140 via an access transistor 160, and similarly the bit line 190 is connected to the node 150 via an access transistor 170.

Two different states can be stored within the memory cell shown in FIG. 2, a first state being where the node 140 is at a ground potential and the node 150 is at a supply potential $V_{DD}$, and the second state being a state where the node 140 is at the supply potential $V_{DD}$ and the node 150 is at the ground potential.

Figure 3:
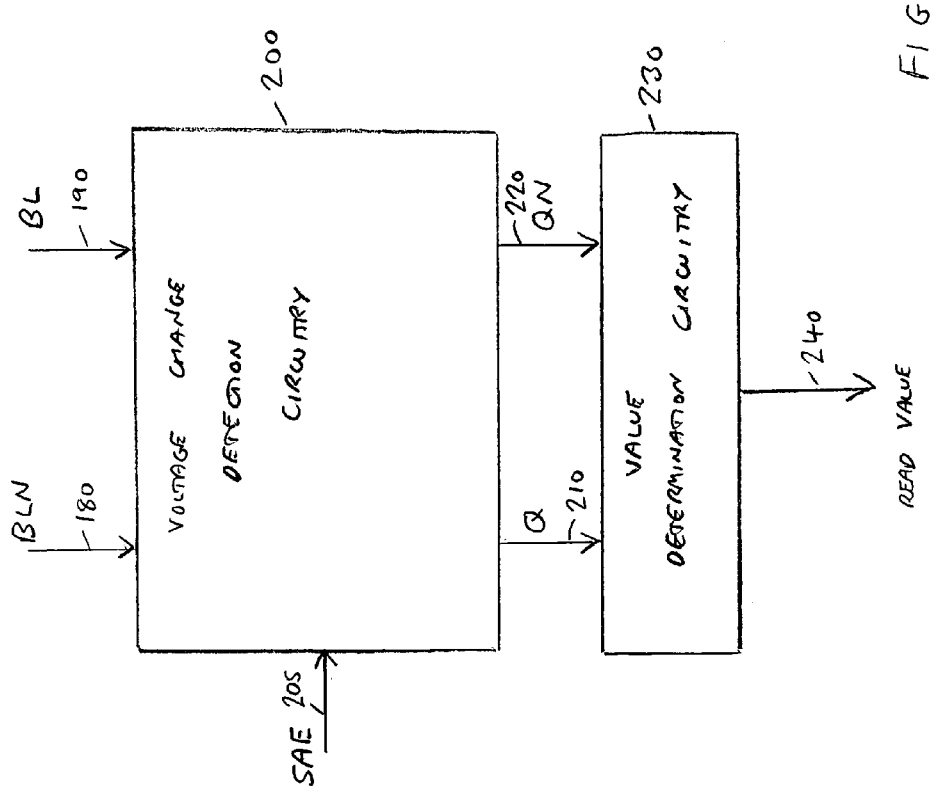
FIG. 3 is a block diagram illustrating the signals received and output by sense amplifier circuitry in accordance with one embodiment of the present invention.

FIG. 3 is a block diagram illustrating the various signals received and produced by sense amplifier circuitry employed within the data path access unit 40 of FIG. 1 in accordance with one embodiment of the present invention. The sense amplifier has voltage change detection circuitry 200 for detecting a differential between the voltages on the pair of input bit lines 180, 190 caused by one of those bit lines being discharged during a read operation. However, the analysis of the voltage levels on the two bit lines 180, 190 is only performed by the voltage change detection circuitry when a sense amp enable (SAE) signal received over path 205 is set to identify a sensing stage of operation. Initially the SAE signal is not set and it is only after some predetermined time following the start of the read operation that the SAE signal is set, this time corresponding to a point where the voltage on one of the bit lines is expected to have dropped by some predetermined amount $\Delta V$. This $\Delta V$ amount is typically determined during a circuit analysis operation at the time the circuit is developed to take account of operating margins of the various components making up the voltage change detection circuitry. If an attempt were to be made to seek to detect the value stored in the connected memory cell prior to the voltage on one of the bit lines having dropped by $\Delta V$, it is possible that the sense amplifier would not work correctly, in that an incorrect value could be determined.

At the start of the sensing stage of operation indicated by the setting of the SAE signal, both of the output values Q and QN on paths 210, 220, respectively, will be at a predetermined voltage level and as a result of the analysis performed by the voltage change detection circuitry one of those output values will transition to a different voltage level. In one embodiment, both of the output values 210, 220 are initially at a logic zero voltage level, and during the sensing stage of operation one of those output values will transition to the logic one output level.

The value determination circuitry 230 then determines the value stored in the memory cell dependent on which of the output values 210, 220 has transitioned to the logic one voltage level. The value determination circuitry also typically includes a latch for holding that result value so that it can continue to be output after the sensing stage of operation has finished.

Figure 4:
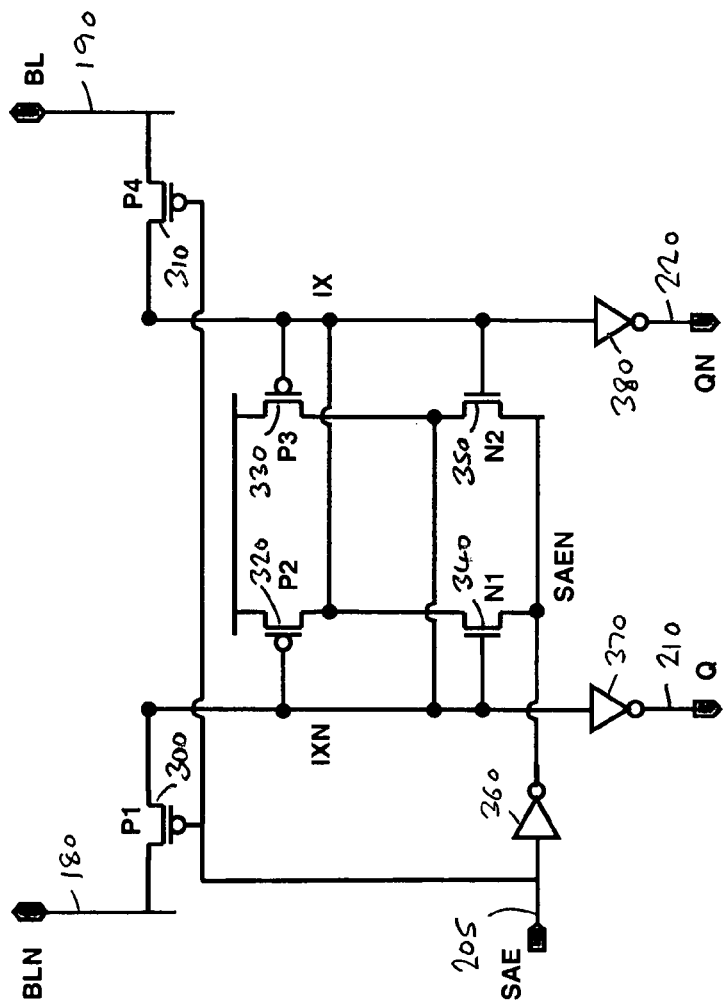
FIG. 4 illustrates a known arrangement of components that may be used to form the voltage change detection circuitry of a sense amplifier.

FIG. 4 is a diagram providing a schematic illustration of the components provided within a known differential voltage sense amplifier to form the voltage change detection circuitry. The voltage change detection circuitry of FIG. 4 has two pairs of latch transistors 320, 330 and 340, 350, each pair being cross-coupled. In particular, considering the pair of latch transistors 340, 350, the drain of each transistor is connected to the gate of the other transistor. Similarly, considering the pair of latch transistors 320, 330, the source of each transistor is connected to the gate of the other transistor. Together, these two pairs of latch transistors operate as a latch during a sensing stage of operation such that, dependent on the initial voltage levels at the two internal nodes IXN and IX, one of the output signals Q, QN over paths 210, 220 will transition to a logic one voltage level.

In the example given in FIG. 4, the drain of each latch transistor 320, 330 is connected to a supply voltage level $V_{DD}$ and the source of each of the latch transistors 340, 350 is connected to an inverted version of the SAE signal received over path 205, which is inverted via the inverter 360. During the sensing stage of operation, this inverted SAE value (SAEN) forms a virtual ground level.

Before activating the sense amplifier with a rising edge of the SAE signal received over path 205, the internal sense amplifier nodes IXN and IX are precharged to the voltage levels on bit lines 180, 190, respectively, through input transistors 300, 310, respectively, which in this example are PMOS devices, and accordingly are turned on whilst the SAE signal is at a logic zero level. Then, as soon as the bit line voltage levels reach values such that their voltage difference corresponds to at least the defined read margin $\Delta V$, the sense amplifier is fired with a rising edge of the SAE signal on path 205. As the SAE signal goes high, the transistors 300, 310 are turned off, and the SAEN node is pulled down to ground via the inverter 360.

Thereafter, the voltages stored on both internals nodes IXN and IX are evaluated by the differential pair formed by the transistors 320, 330, 340, 350. Both of the NMOS transistors 340, 350 are critical during this phase, as the one of them that conducts the strongest will pull down the intermediate node connected to its drain and make the sense amplifier switch. In particular, such action will cause one of the nodes to discharge to zero, which will then be inverted via the relevant inverter 370, 380 to produce a logic one voltage level on one of the output lines 210, 220. In a typical known design, the designers usually try to make the differential pair as balanced as possible, in order to get a switching behaviour that is as symmetrical as possible.

Figure 5:
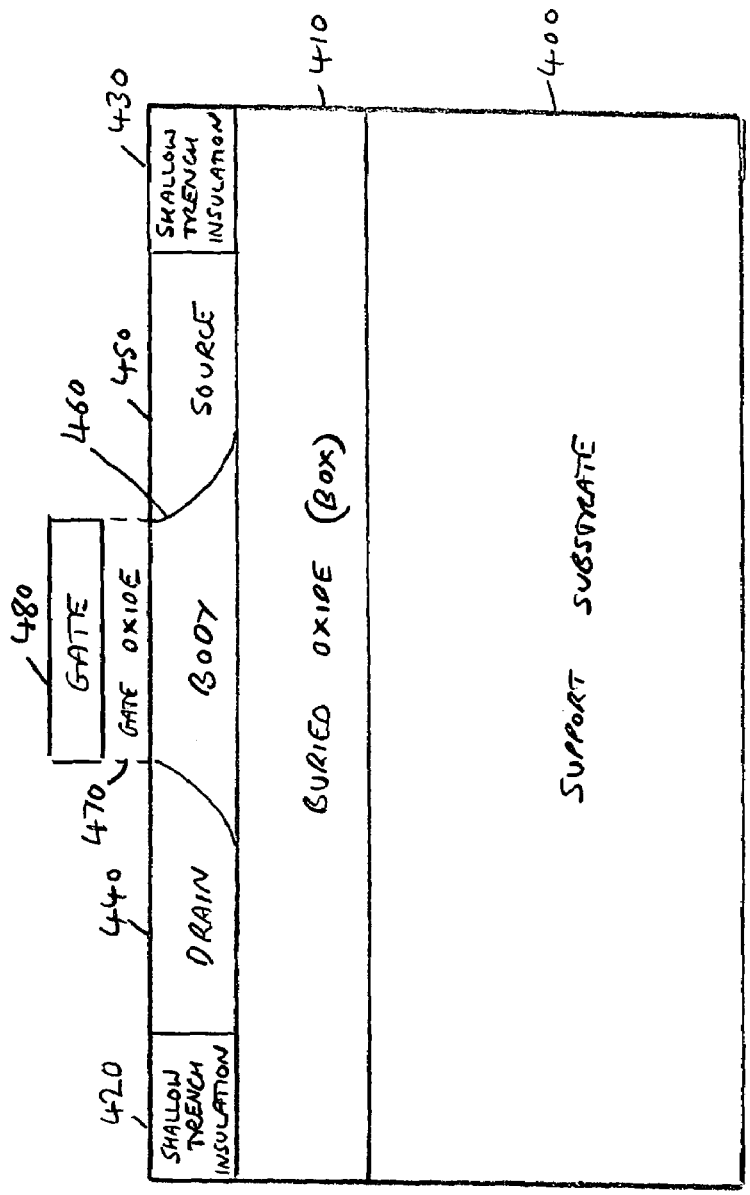
FIG. 5 is a simplified cross-sectional view of a transistor constructed using SOI technology.

The various transistors within the voltage change detection circuitry can be constructed in a variety of ways, but in accordance with one known technique the transistors are constructed using SOI technology, which produces a body region which is insulated from the substrate. This is illustrated schematically in FIG. 5, which provides a simplified cross-sectional view through such an SOI transistor. As shown in FIG. 5, a buried oxide (BOX) region 410 is typically provided on a support substrate 400, and then the transistor is formed within a region above the BOX layer, the extent of that region being defined by shallow trench insulation regions 420, 430 at either side of that region. The "body" 460 of an SOI transistor is then formed by channel material that remains after the drain and source complementary material has been added to define the drain and source regions 440, 450, respectively. A gate 480 is then provided over the body region, and separated from the body region via a gate oxide layer 470.

For an N-channel transistor the body 460 is generally P type material and the source and drain are both formed from N+ type material. Similarly, for a P-type transistor, the body is generally N type material and the source and drain are both formed from P+ type material.

As mentioned previously, such SOI transistors can exhibit reduced resistive leakage to the substrate and capacitive loading by the substrate, giving rise to faster operation and lower power dissipation when compared with transistors constructed using non-insulated technologies that form the channel material on a conducting substrate. However, as also discussed previously, care has to be taken when using such transistors to provide mechanisms which would remove any history effect that might otherwise occur as a result of variations in body voltage that build up over time, and which might adversely affect circuit behaviour. However, the known techniques for removing the history effect can give rise to a strongly forward-biased diode between the body region and source region of the transistor during the sensing stage of operation, which can give rise to significant extra power consumption, can cause any connected bit lines to be discharged more than expected, and can give rise to noise on the bit lines.

Figure 6:
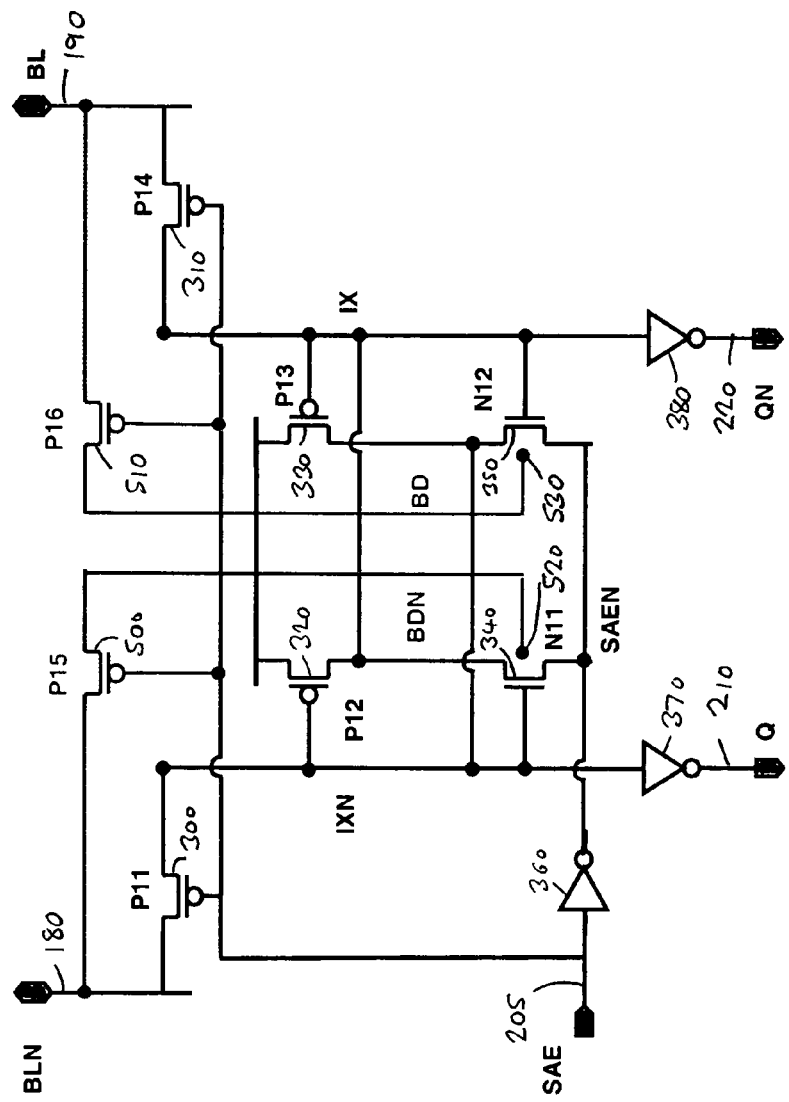
FIG. 6 is a diagram illustrating the components provided within the voltage change detection circuitry of the sense amplifier of FIG. 3 in accordance with one embodiment of the present invention.

FIG. 6 illustrates the components that may be provided to form the voltage change detection circuitry of one embodiment of the present invention, in order to alleviate the above concerns. Those components which are the same as the components of the known device of FIG. 4 are indicated with the same reference numerals.

As can be seen from a comparison of FIG. 6 with FIG. 4, two additional transistors 500, 510 are provided for selectively coupling the body regions 520, 530 of the latch transistors 340, 350 to the bit line voltage levels. These additional transistors are referred to herein as precharge biasing transistors, since during a normal precharge phase of the sense amplifier whilst the SAE signal 205 is still at a logic zero level, these transistors 500, 510 (which in the embodiment described are formed as PMOS transistors) are turned on thereby coupling each of the internal nodes 520, 530 of the two latch transistors 340, 350 to associated bit lines 180, 190, respectively. Hence, during the precharge phase, the body regions will be biased to a known potential, and in particular one of the body regions will be biased to the supply potential $V_{DD}$ and the other body region will be biased to the voltage $V_{DD}-\Delta V$.

Thereafter, when the SAE signal 205 goes high to identify the start of the sensing stage of operation, the precharge biasing transistors 500, 510 are turned off, thereby causing the voltages applied to the body regions 520, 530 to float. From this point, the precharged body regions 520, 530 are disconnected for the entirety of the sensing operation.

As a result of this operation, the history effect is removed, since both of the NMOS transistors 340, 350 have there body regions precharged to a given voltage level during each cycle of operation, and accordingly these body regions cannot drift to unknown voltage levels over time. Accordingly, this removes any uncertainty regarding the sensed values on the circuit outputs.

Further, since during the sensing operation the body regions are no longer coupled to any potential, and instead are caused to float, the falling edge of the SAEN node resulting from the rising edge of the SAE signal over path 205 will pull down the potential on both NMOS body regions 520, 530 to a lower value, due to the body/source coupling capacitances of the transistors 340, 350. As a consequence, these body voltages are then lower than the threshold voltage of the diode formed between the body and source regions, and hence such diodes are maintained reverse-biased during the sensing operation, thereby removing the additional power consumption that would occur were those diodes to have been forward-biased.

Furthermore, when the sense amplifier is activated by the rising SAE signal, it can be seen from FIG. 6 that all of the transistors 300, 310, 500, 520 are turned off, so that both bit lines 180, 190 are disconnected from the circuit for the entirety of the sensing operation, and accordingly there are no current sources able, to discharge or bring noise onto the bit lines. Accordingly, the bit lines will not be discharged more than expected, providing improved power consumption benefits, and further no noise will be present on the bit lines, which might otherwise have given rise to potential inaccuracies in operation.

Another important benefit that arises when using the circuitry of FIG. 6 is that improved switching is exhibited. In particular, due to the differential in the voltage levels to which the two body regions 520, 530 are precharged, the differential pair formed by the transistors 340, 350 is always unbalanced on the correct side having regards to the operation of the circuitry when the subsequent sensing stage of operation begins. For example, if the voltage on bit line 190 is $V_{DD}$ and the voltage on bit line 180 is $V_{DD}-\Delta V$, this means that the body region of transistor 530 will be precharged to a higher voltage level than the body region of transistor 340, and this will in turn give rise to a lower threshold voltage in the transistor 350 as compared with the threshold voltage in the transistor 340. This means that during the sensing stage of operation the transistor 350 will become more strongly conducting than the transistor 340 as a result of those differential body voltages, and accordingly the node IXN will be discharged to a logic zero level more easily than the node IX, which is exactly the behaviour required. Indeed, the node IXN falling to a logic zero level will mean that the Q output on path 210 will rise to a logic one level, which will identify that the voltage on node 190 is equal to $V_{DD}$.

In a similar manner, if the voltage on bit line 190 equals $V_{DD}-\Delta V$ and the voltage on bit line 180 equals $V_{DD}$, then for the same reasoning the transistor 340 will more strongly conduct during the sensing stage than the transistor 350, and so the differential pair is predisposed to produce a logic one value on the QN output 220.

This unbalancing of the differential pair due to the differential voltages applied to the body regions complements the unbalancing produced by the differential gate voltages applied to the transistors 340, 350, and serves to produce a circuit exhibiting faster switching than the known circuit of FIG. 4.

This property of the circuitry of FIG. 6 can be used during the design stage to lower the amount of the read margin $\Delta V$ since as discussed earlier the circuitry is predisposed toward producing the desired output and hence will still be able to produce correct results for a reduced differential in voltage between the two bit lines.

Figure 7:
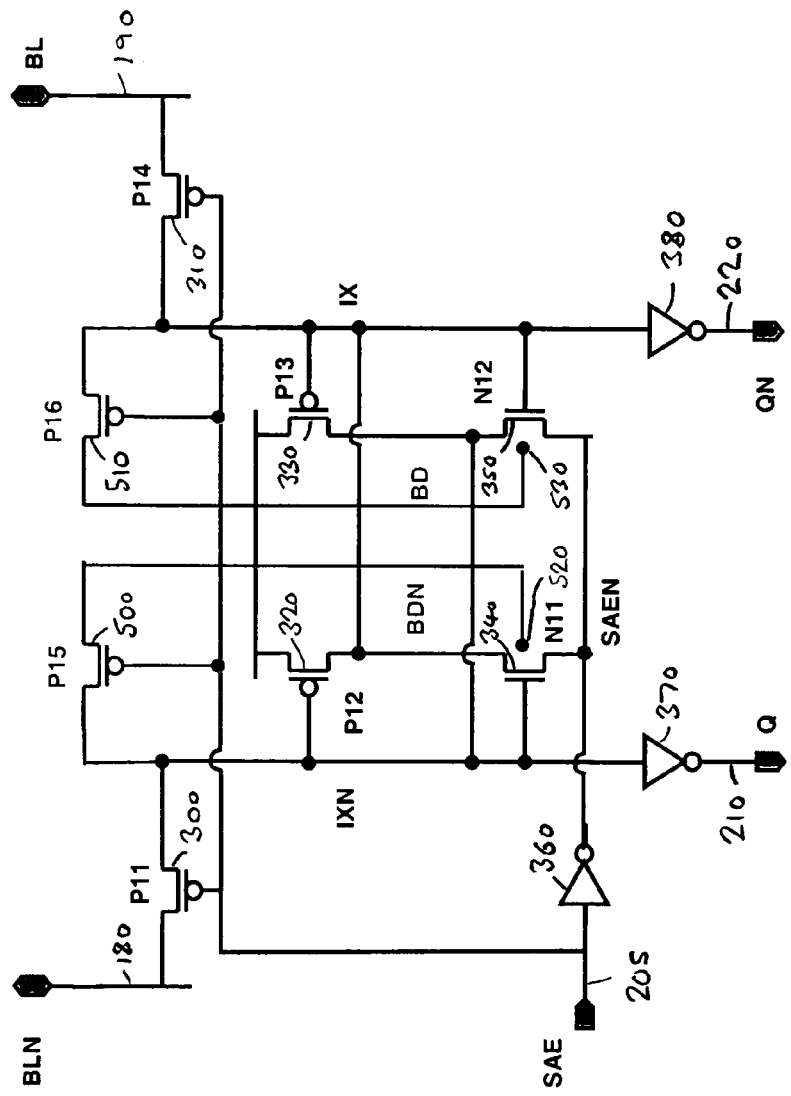
FIG. 7 is a diagram illustrating the components provided within the voltage change detection circuitry of the sense amplifier of FIG. 3 in accordance with an alternative embodiment of the present invention.

FIG. 7 illustrates an alternative construction for the voltage change detection circuitry 200 of FIG. 3 in accordance with an alternative embodiment of the present invention. As can be seen, the basic circuit elements are the same, but the precharged biasing transistors 500, 510 do not directly couple the body regions 520, 530 with respective bit lines 180, 190, but instead couple those body regions with the bit lines via the input transistors 300, 310. As mentioned previously, the transistors 300, 310, 500, 510 are turned on and off at the same time, as they are all driven via the SAE value on path 205, and accordingly the circuitry of FIG. 7 operates in the same way as the circuitry of FIG. 6.

Whilst in FIGS. 6 and 7 the precharge biasing transistors 500, 510 are shown as being driven by the SAE signal on path 205, it will be appreciated that in an alternative embodiment the precharge biasing transistors may receive their own dedicated enable signal, which may for example be completely independent of the SAE or SAEN values.

In one embodiment of the present invention, all of the various transistors shown in the embodiments of FIG. 6 and FIG. 7 are formed as MOSFET devices. The transistors 340, 350 are in preferred embodiments constructed as body-contact MOSFET devices. Whilst in FIGS. 6 and 7 no assumptions have been made about the other transistors, these may also be formed as body-contact MOSFET devices. No assumption has been made about the body voltages applied to the other latch transistors 320, 330 or the input transistors 300, 310. These could be permanently left floating, could be permanently tied to a supply potential such as $V_{DD}$, some of them may be connected together, or any possible combination of the above options may be used. The same options are available for the precharge biasing transistors 500, 510.

Further, it will be appreciated that in some embodiments where all the transistors have body regions insulated from the substrate, the body regions of one or both of transistors 320, 300 may also be connected to the BDN voltage level in addition to the body region 520 of the transistor 340. Similarly, one or both of the body regions of the transistors 330, 310 may also be connected to the BD node to which the body region 530 of the transistor 350 is connected.

It will also be appreciated that whilst in the examples of FIGS. 6 and 7, certain transistors are made as PMOS devices and other transistors are made as NMOS devices, all transistors shown in FIGS. 6 and 7 could be made with a complementary type of transistor, in which case the $V_{DD}$ and ground supplies would be reversed.

It will be appreciated that whilst the techniques of embodiments of the present invention have been described with respect to specific embodiments illustrated in FIGS. 6 and 7, the same basic concept can be applied to all sense differential designs based on latched architectures.

Finally, it will be appreciated that whilst, for the purposes of describing an embodiment of the present invention, it is assumed that the transistors are constructed using SOI technology, the same concept can be applicable to any other technologies where the devices are produced with body regions insulated from the substrate, as for example may be the case for triple-well devices constructed using bulk technology.

Although a particular embodiment of the invention has been described herein, it will be apparent that the invention is not limited thereto, and that many modifications and additions may be made within the scope of the invention. For example, various combinations of the features of the following dependent claims could be made with the features of the independent claims without departing from the scope of the present invention.

I claim:

1. Sensing circuitry, comprising:
   voltage change detection circuitry for detecting a change in voltage on at least one input line and for producing at least one output signal indicative of said change during a sensing stage of operation;
   said voltage change detection circuitry comprising at least one latch transistor having a body region insulated from a substrate; and body biasing circuitry which prior to the sensing stage of operation causes a voltage to be applied to the body region that is derived from the voltage on one of said at least one input lines, and which during said sensing stage of operation causes the voltage of the body region to float.

2. The sensing circuitry as claimed in claim 1, wherein:
said at least one latch transistor comprises a pair of latch transistors and said at least one input line comprise a pair of input lines, the pair of latch transistors for detecting a differential between the voltages on the pair of input lines caused by said change in voltage;
the body biasing circuitry being arranged to cause a first voltage to be applied to the body region of a first latch transistor in said pair of latch transistors, the first voltage being derived from the voltage on a first input line of said pair of input lines, and to cause a second voltage to be applied to the body region of a second latch transistor in said pair of latch transistors, the second voltage being derived from the voltage on a second input line of said pair of input lines, during said sensing stage of operation the body biasing circuitry causing the voltages of the body regions of both the first and second latch transistors to float.

3. The sensing circuitry of claim 2, wherein the pair of latch transistors are cross-coupled.

4. The sensing circuitry of claim 1, further comprising:
an input transistor associated with each of said at least one input lines and arranged to couple the associated input line with said at least one latch transistor, said input transistor receiving a sensing enable signal at its gate which disables the input transistor during said sensing stage.

5. The sensing circuitry of claim 1, wherein said body biasing circuitry comprises a precharge biasing transistor associated with each of said at least one input lines and arranged to couple the associated input line with the body region of at least one of said at least one latch transistors, said precharge biasing transistor receiving an enable signal at its gate which disables the precharge biasing transistor during said sensing stage so as to cause the voltage of the body region to float.

6. The sensing circuitry as claimed in claim 5, wherein said enable signal is a sensing enable signal also provided to one or more input transistors of the sensing circuitry used to couple each input line with said at least one latch transistor.

7. The sensing circuitry of claim 5, wherein each precharge biasing transistor has one of its drain or its source connected to the associated input line and the other of its drain or its source connected to the body region of each latch transistor associated with that precharge biasing transistor.

8. The sensing circuitry of claim 6, wherein each precharge biasing transistor has one of its drain or its source connected to one of said one or more input transistors and the other of its drain or its source connected to the body region of each latch transistor associated with that precharge biasing transistor.

9. The sensing circuitry of claim 2, wherein said body biasing circuitry comprises a pair of precharge biasing transistors, each precharge biasing transistor being associated with one input line of said pair of input lines and arranged to couple the associated input line with an associated latch transistor of said pair of latch transistors, each precharge biasing transistor receiving an enable signal at its gate which disables that precharge biasing transistor during said sensing stage so as to cause the voltage of the body region of the associated latch transistor to float.

10. The sensing circuitry of claim 1, further comprising:
at least one input transistor for coupling an associated input line with said at least one latch transistor, each input transistor having a body region insulated from the substrate; and
said body biasing circuitry further being arranged prior to the sensing stage of operation to cause a voltage to be applied to the body region of each input transistor that is derived from the voltage on one of said at least one input lines, and during said sensing stage of operation to cause the voltage of the body region of each input transistor to float.

11. The sensing circuitry of claim 1, wherein each latch transistor comprises a body-contact MOSFET device.

12. The sensing circuitry as claimed in claim 1, wherein each latch transistor is fabricated as a silicon-on-insulator (SOI) device.

13. The sensing circuitry as claimed in claim 1, wherein each input line is a bit line coupled with a memory device, and the sensing circuitry forms a sense amplifier for detecting a value stored in a memory cell of the memory device.

14. A sense amplifier for detecting a value stored in a memory cell, comprising:
voltage change detection circuitry for detecting a change in voltage on at least one bit line connected to the memory cell and for producing at least one output signal indicative of said change during a sensing stage of operation;
value determination circuitry for determining said value from said at least one output signal;
said voltage change detection circuitry comprising at least one latch transistor having a body region insulated from a substrate; and
body biasing circuitry which prior to the sensing stage of operation causes a voltage to be applied to the body region that is derived from the voltage on one of said at least one bit lines, and which during said sensing stage of operation causes the voltage of the body region to float.

15. Sensing circuitry, comprising:
voltage change detection means for detecting a change in voltage on at least one input line and for producing at least one output signal indicative of said change during a sensing stage of operation;
said voltage change detection means comprising at least one latch means having a body region insulated from a substrate; and
body biasing means for applying a voltage level to the body region prior to the sensing stage of operation, the voltage level being derived from the voltage level on one of said at least one input lines, the body biasing means further for causing the voltage of the body region to float during said sensing stage of operation.

16. A method of operating sensing circuitry used to detect a change in voltage on at least one input line connected to the sensing circuitry, and to produce at least one output signal indicative of said change during a sensing stage of operation, said sensing circuitry including at least one latch transistor having a body region insulated from a substrate, and the method comprising the steps of:
prior to the sensing stage of operation, applying a voltage to the body region that is derived from the voltage on one of said at least one input lines; and
during said sensing stage of operation, causing the voltage of the body region to float.

* * * * *